(12) United States Patent
Gerber

(10) Patent No.: US 11,146,234 B2
(45) Date of Patent: Oct. 12, 2021

(54) ELECTRICAL DEVICE AND METHOD FOR MANUFACTURING THE SAME

(71) Applicant: Advanced Semiconductor Engineering, Inc., Kaohsiung (TW)

(72) Inventor: Mark Gerber, Sunnyvale, CA (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 9 days.

(21) Appl. No.: 16/443,545

(22) Filed: Jun. 17, 2019

(65) Prior Publication Data

US 2019/0393859 A1    Dec. 26, 2019

Related U.S. Application Data

(60) Provisional application No. 62/688,929, filed on Jun. 22, 2018.

(51) Int. Cl.
*H03H 9/10* (2006.01)
*H03H 9/17* (2006.01)
*H03H 9/54* (2006.01)
*H03H 9/02* (2006.01)
*H03H 9/15* (2006.01)

(52) U.S. Cl.
CPC ...... *H03H 9/1007* (2013.01); *H03H 9/02007* (2013.01); *H03H 9/17* (2013.01); *H03H 9/54* (2013.01); *H03H 2009/155* (2013.01)

(58) Field of Classification Search
CPC .......... H03H 9/10; H03H 9/1057; H03H 9/17; H03H 9/174; H03H 9/54
See application file for complete search history.

(56) References Cited

U.S. PATENT DOCUMENTS

2020/0021265 A1*    1/2020  Lee .................... H03H 9/173

* cited by examiner

*Primary Examiner* — Dean O Takaoka
(74) *Attorney, Agent, or Firm* — Foley & Lardner LLP

(57) ABSTRACT

An electrical device includes an electronic component, a membrane and a cover. The electronic component has a first surface and a second surface opposite to the first surface. The electronic component has a cavity extending from the first surface of the electronic component into the electronic component. The membrane is disposed within the cavity of the electronic component. The cover is disposed on the first surface of the electronic component.

18 Claims, 13 Drawing Sheets

ELECTRICAL DEVICE AND METHOD FOR MANUFACTURING THE SAME

CROSS-REFERENCE TO RELATED APPLICATIONS

This application claims the benefit of and priority to U.S. Provisional Application No. 62/688,929, filed Jun. 22, 2018, the contents of which are incorporated herein by reference in their entirety.

BACKGROUND

1. Technical Field

The present disclosure relates generally to an electrical device and a method of manufacturing the same. More particularly, the present disclosure relates to an electrical device including a membrane and a method of manufacturing the same.

2. Description of the Related Art

In some electrical devices (e.g., bulk acoustic wave (BAW) filter, micro-electro mechanical system (MEMS) and so forth), a membrane (e.g., a resonator membrane) or a thin film is included in the middle of a die. To avoid adversely affecting the performance of the electrical device, the membrane should be isolated from any other objects (e.g., a clearance for the membrane is specified). However, this would increase the size (e.g., area and/or thickness) of the electrical device.

SUMMARY

In one or more embodiments, an electrical device includes an electronic component, a membrane and a cover. The electronic component has a first surface and a second surface opposite to the first surface. The electronic component has a cavity extending from the first surface of the electronic component into the electronic component. The membrane is disposed within the cavity of the electronic component. The cover is disposed on the first surface of the electronic component.

In one or more embodiments, an electrical device includes an electronic component and a membrane. The electronic component has a first surface and a second surface opposite to the first surface. The electronic component has a cavity extending from the first surface of the electronic component into the electronic component. The membrane is disposed within the cavity of the electronic component. The membrane has a resonating portion physically isolated from the electronic component and electrodes electrically connected to the electronic component.

In one or more embodiments, a method of forming an electrical device includes providing a first wafer having a plurality of dies, each die having a plurality of conductive pads, a cavity and a membrane within the cavity; providing a second wafer having a plurality of holes; and attaching the first wafer to the second wafer so that the conductive pads of the first wafer are exposed from the holes of the second wafer.

BRIEF DESCRIPTION OF THE DRAWINGS

Aspects of the present disclosure are best understood from the following detailed description when read with the accompanying drawings. It is noted that various features may not necessarily be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
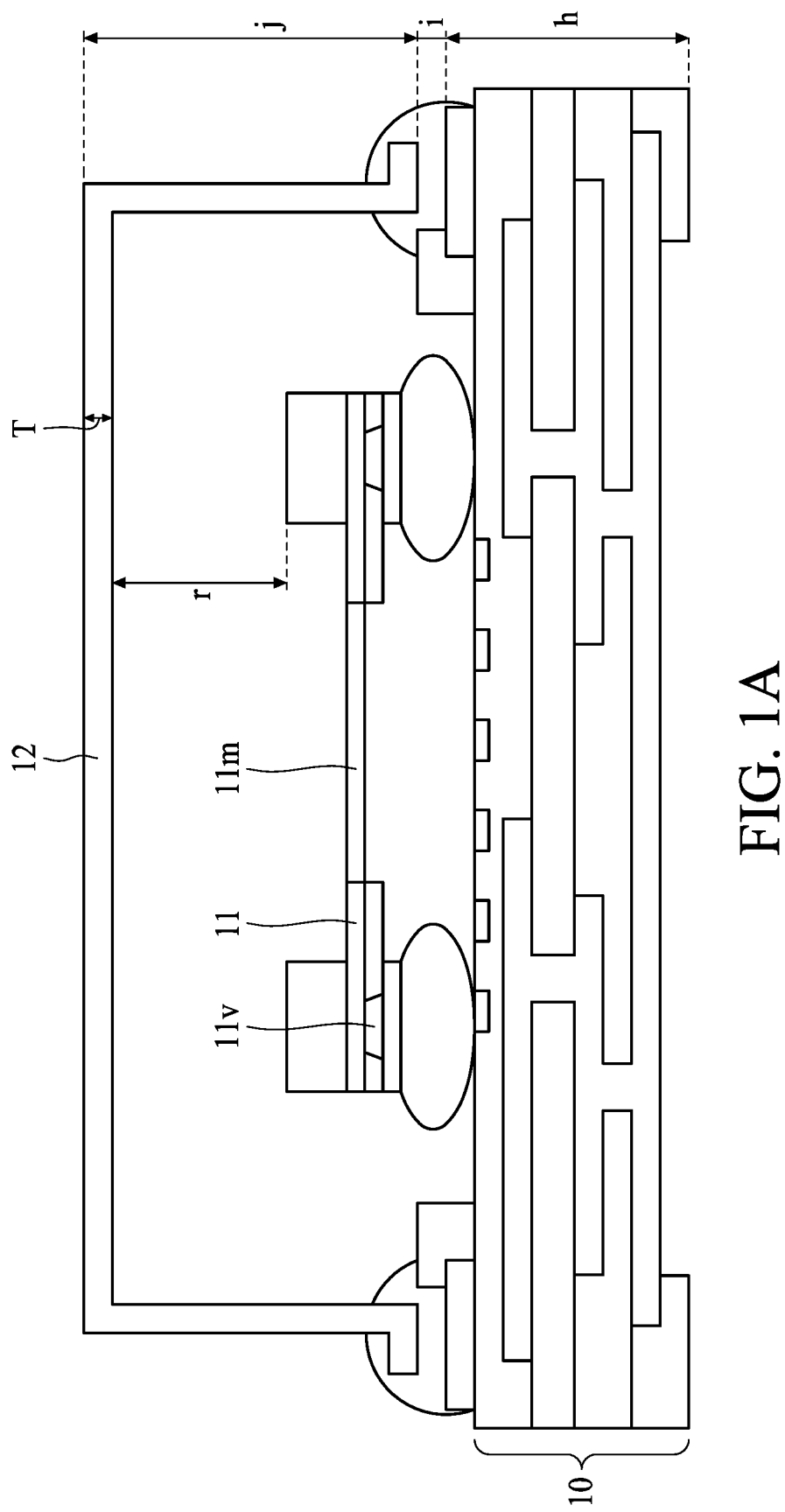
FIG. 1A illustrates a cross-sectional view of an electrical device in accordance with some embodiments of the present disclosure.

Structures, manufacturing and use of the embodiments of the present disclosure are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the drawings are disclosed below using specific language. It will nevertheless be understood that the embodiments or examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

Figure 1B:
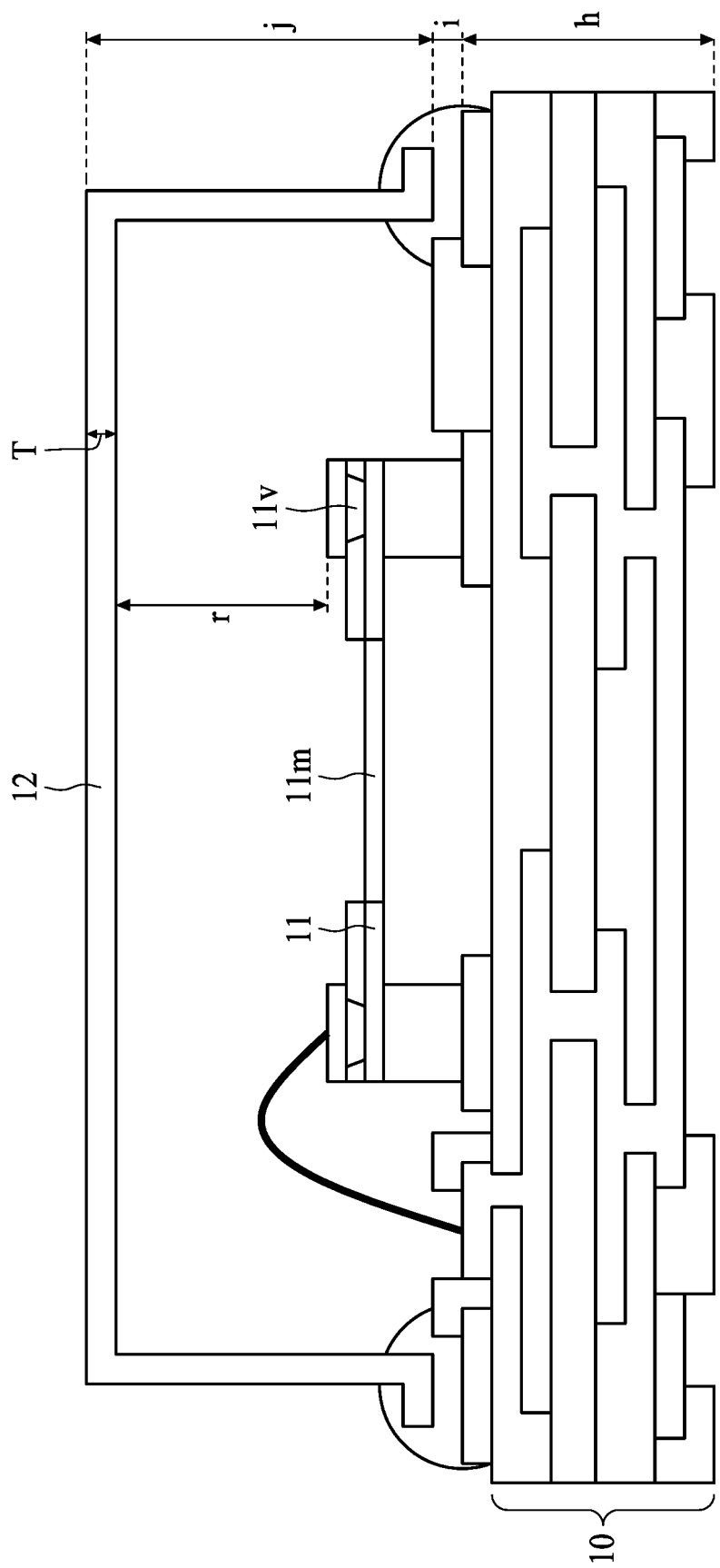
FIG. 1B illustrates a cross-sectional view of an electrical device in accordance with some embodiments of the present disclosure.

FIG. 1A illustrates a cross-sectional view of an electrical device 1A in accordance with some embodiments of the present disclosure. The electrical device 1A includes a substrate 10, a die/chip 11 and a metal lid 12. FIG. 1B illustrates a cross-sectional view of an electrical device 1B in accordance with some embodiments of the present disclosure. The electrical device 1B in FIG. 1B is similar to that in FIG. 1A except that the die 11 in FIG. 1A is connected to the substrate 10 by flip-chip technique while the die 11 in FIG. 1B is connected to the substrate 10 by wire bonding technique.

In some embodiments, as shown in FIG. 1A, the die 11 is electrically connected to solder balls through a through via 11v (e.g., through-silicon via (TSV)) and the solder balls are electrically connected to the substrate 10. The die 11 in FIGS. 1A and 1B include a membrane 11m (or thin film). In some embodiments, the membrane 11m can be used for a BAW resonator filter or MEMS to receive or detect at least one physical signal from environment (e.g., sound, pressure, temperature, humidity, gas, and the like).

The metal lid 12 is disposed on the substrate 10 to cover the die 11 and to prevent the membrane 11m from being in contact with other objects. As shown in FIGS. 1A and 1B, due to the thickness h of the substrate 10, the thickness T and the height j of the lid 12, a distance i between the lid 12 and the substrate 10 and a distance r between the lid and the die 11, the size of each of the electrical devices 1A and 1B in FIGS. 1A and 1B is relatively large, which would hinder the miniaturization of the electrical devices 1A and 1B. In addition, the lid 12 and the conductive via 11v would increase the manufacturing cost of the electrical devices 1A and 1B. Furthermore, it is also challenging to overcome the following issues of the electrical devices 1A and 1B: work-outgassing of lid attach, flux contamination of solder attach process, the high stress of solder attach process on thin piezoelectric materials, the popcorn issue due to the large volume of air and trapped inside of lid-expansion during reflow process.

Figure 2:
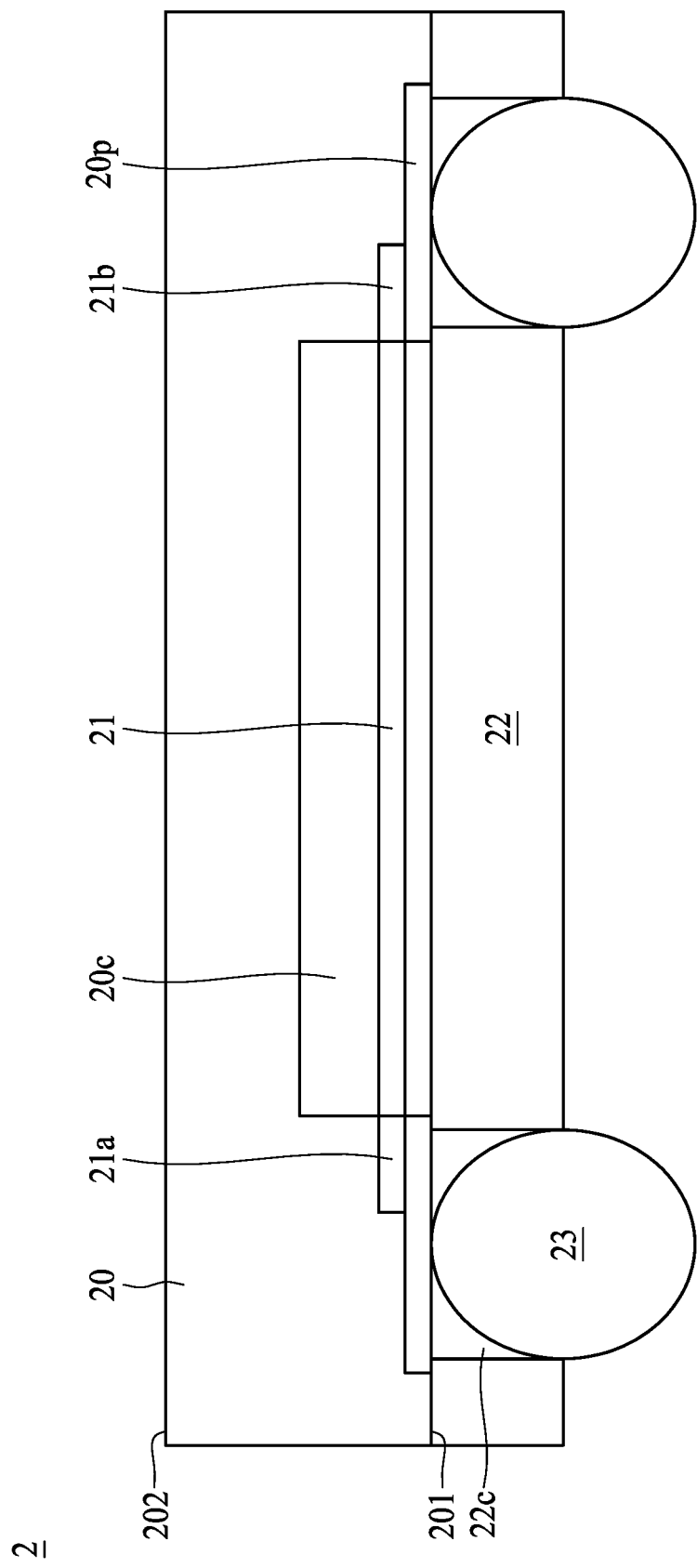
FIG. 2 illustrates a cross-sectional view of an electrical device in accordance with some embodiments of the present disclosure.

FIG. 2 illustrates a cross-sectional view of an electrical device 2 in accordance with some embodiments of the present disclosure. The electrical device 2 includes an electronic component 20, a membrane 21 (or thin film), a cover 22 and electrical contacts 23.

The electronic component 20 may be a die or a chip. The electronic component 20 includes a semiconductor substrate (Si or SiC), a ceramic substrate or a glass substrate, one or more integrated circuit devices and one or more overlying interconnection structures therein. The integrated circuit devices may include active devices such as transistors and/or passive devices such resistors, capacitors, inductors, or a combination thereof. The electronic component 20 has surface 201 (e.g., an active surface) and a surface 202 (e.g., a back surface) opposite to the surface 201. The electronic component 20 may include a cavity 20c extending from the surface 201 of the electronic component 20 into the electronic component 20. The cavity 20c is arranged to accommodate the membrane 21, allowing the membrane 21 resonating within the cavity 20c. The cavity 20c is arranged to protect the membrane 21 to isolate the membrane 21 from the environment outside the electronic component 20. The electronic component 20 may include one or more conductive pads 20p on the surface 201 of the electronic component 20 to provide electrical connections. In some embodiments, a thickness of the electronic component 20 is from about 200 micrometer (μm) to about 500 μm.

The membrane 21 is disposed within the cavity 20c of the electronic component 20 and may across the cavity 20c of the electronic component 20. In some embodiments, the membrane 21 is electrically connected to the conductive pads 20p of the electronic component 20 through electrical connections. For example, as shown in FIG. 2, the membrane 21 may include a resonating portion isolated from the electronic component 20 and electrodes 21a and 21b electrically connected to the conductive pads 20p of the electronic component 20. In some embodiments, the membrane 21 can be used as a resonator for a BAW filter. In some embodiments, the membrane 21 can be used for a MEMS device configured to receive or detect at least one physical signal from environment (e.g., sound, pressure, temperature, humidity, gas, and the like). In some embodiments, the MEMS device can be, e.g., a pressure sensor, a microphone, a barometer, a thermometer, a hygrometer, a gas detector, and the like. For example, the membrane 21 includes a piezoelectric material to generate a voltage or potential difference across the electrode 21a and the electrode 21b when deformed or pressed. In some embodiments, the membrane 21 includes an actuator configured to physically change shape or vibrate when an external electric field is applied. In some embodiments, the membrane 21 includes lead zirconate titanate (PZT). In some embodiments, the thickness of the membrane 21 is in a range from about 50 μm to about 100 μm.

The cover 22 is disposed on the surface 201 of the electronic component 20. In some embodiments, the cover 22 is attached to the electronic component 20 through an adhesive layer (e.g., covalent bonding, metallic bonding (e.g., AuSn) glue or tape, not shown in the drawing). The cover 22 includes one or more cavities 22c to expose the conductive pads 20p. In some embodiments, the cover 22 is formed of or includes silicon or glass. If the membrane 21 is used for light sensing, the cover 22 can include glass, otherwise, the cover 22 may include silicon to avoid coefficient of thermal expansion (CTE) mismatch between the cover 22 and the electronic component 20. In some embodiments, the thickness of the cover 22 is in a range from about 200 μm to about 400 μm.

The electrical contacts 23 are disposed within the cavities 22c of the cover 22 and electrically connected to the conductive pads 20p. A portion (e.g., a lower portion) of the electrical contacts 23 is exposed from the cover 22 to provide an electrical connection for the electronic component 20. In some embodiments, the electrical contacts 23 are solder balls, copper pillars or any other suitable elements for providing electrical connections.

In accordance with the embodiments in FIG. 2, since the membrane 21 is disposed within the cavity 20c of the electronic component 20 and covered by the electronic component 20 and the cover 22, the membrane 21 can be protected by the electronic component 20 and the cover 22 without adding a further metal lid. Therefore, the issues encountered by the electrical devices 1A and 1B in FIG. 1A and FIG. 1B can be solved or mitigated. For example, since no further metal lid is included, the size (either the thickness or the area) of the electrical device 2 in FIG. 2 can be reduced. For example, since no through via is included to penetrate the electronic component 20 to be electrically connected to the electrical contacts 23, the manufacturing cost can be reduced.

Figure 3:
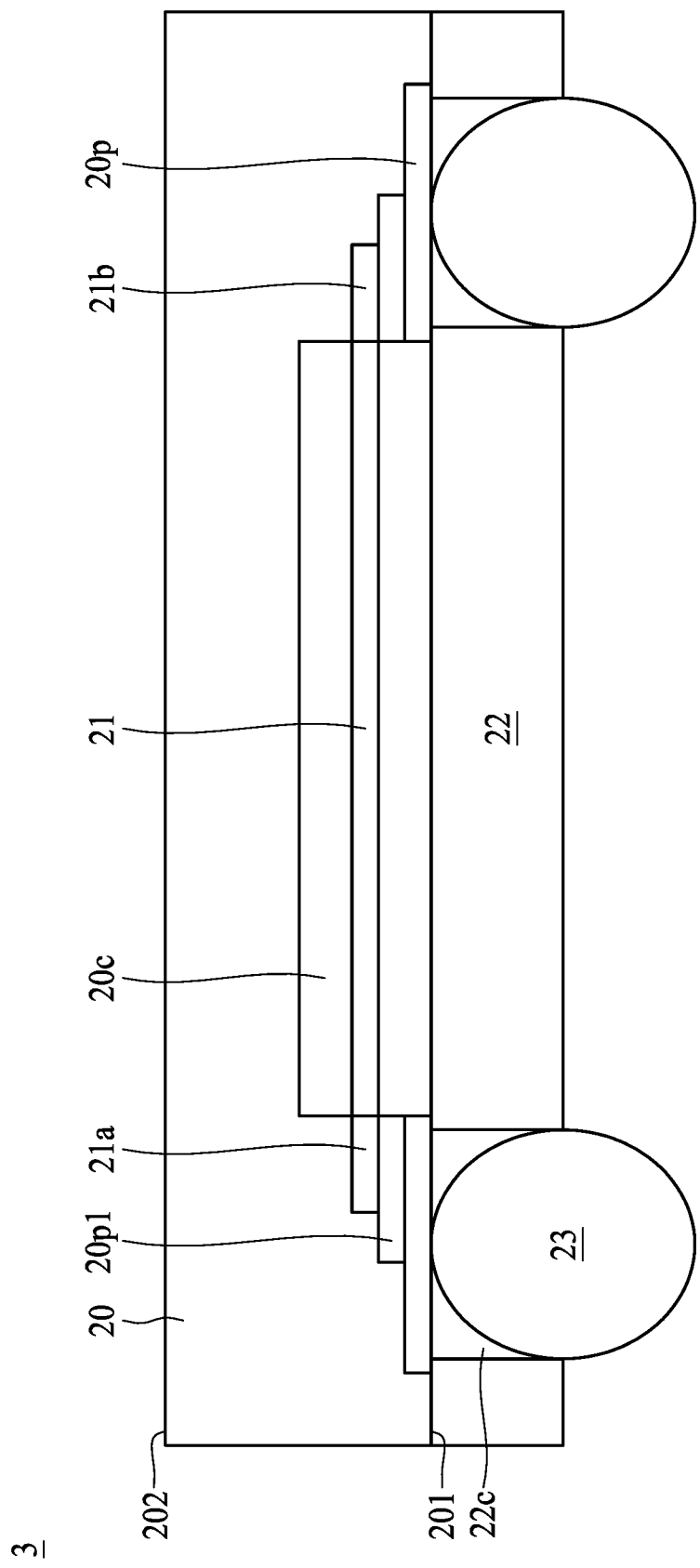
FIG. 3 illustrates a cross-sectional view of an electrical device in accordance with some embodiments of the present disclosure.

FIG. 3 illustrates a cross-sectional view of an electrical device 3 in accordance with some embodiments of the present disclosure. The electrical device 3 in FIG. 3 is similar to the electrical device 2 in FIG. 2 except that in FIG. 2, the membrane 21 (e.g., the electrodes 21a and 21b) is directly connected to the conductive pad 20p while in FIG. 3, the membrane 21 (e.g., the electrodes 21a and 21b) can be connected to the conductive pad 20p through a connection structure 20p1 (e.g., a conductive via, redistribution layer (RDL) and so forth).

Figure 4:
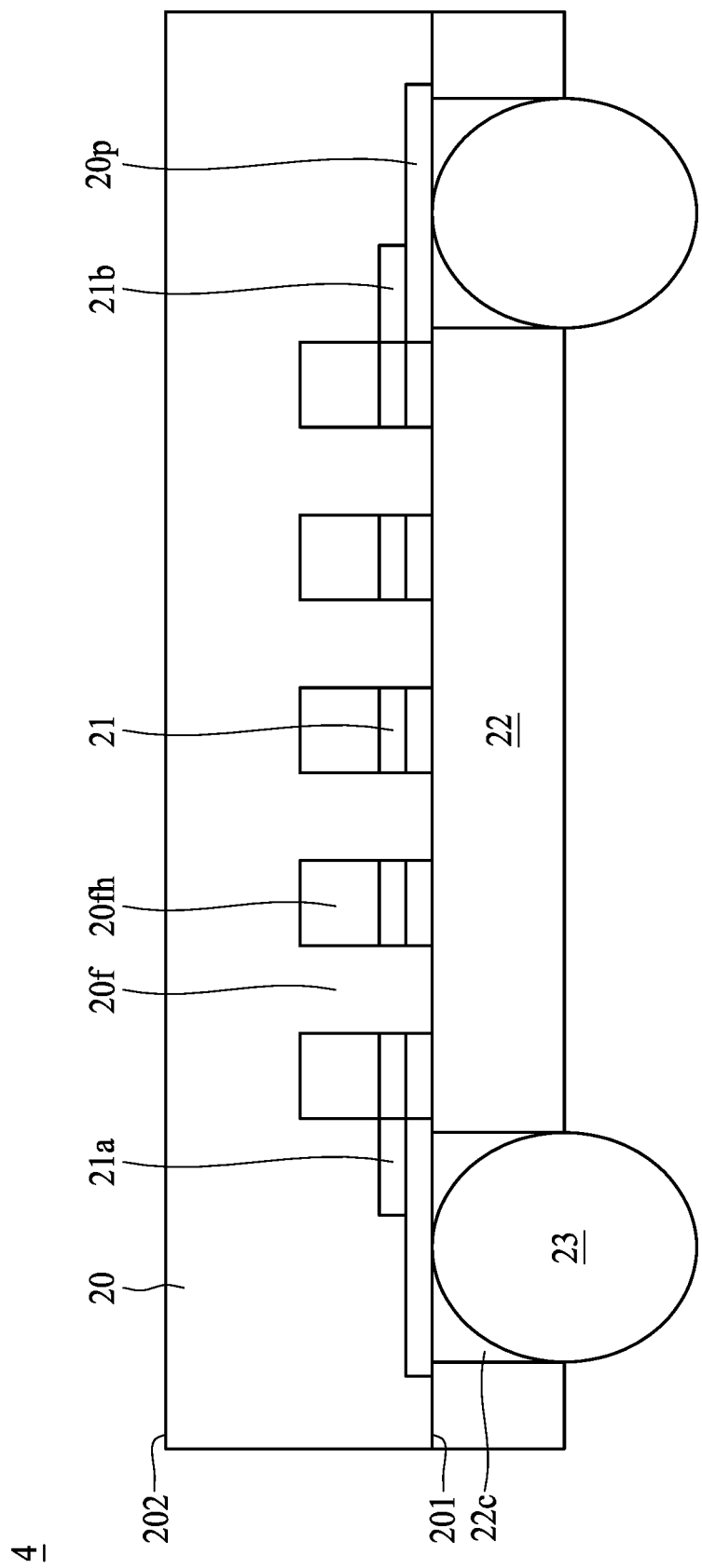
FIG. 4 illustrates a cross-sectional view of an electrical device in accordance with some embodiments of the present disclosure.

FIG. 4 illustrates a cross-sectional view of an electrical device 4 in accordance with some embodiments of the present disclosure. The electrical device 4 in FIG. 4 is similar to the electrical device 2 in FIG. 2 except that in FIG. 4, the electronic component 20 further includes a fence structure 20f. The fence structure 20f defines a plurality of openings 20fh. Therefore, a portion of the membrane 21 is covered by the fence structure 20f while the other portion of the membrane 21 is exposed from the openings 20fh.

Figure 5:
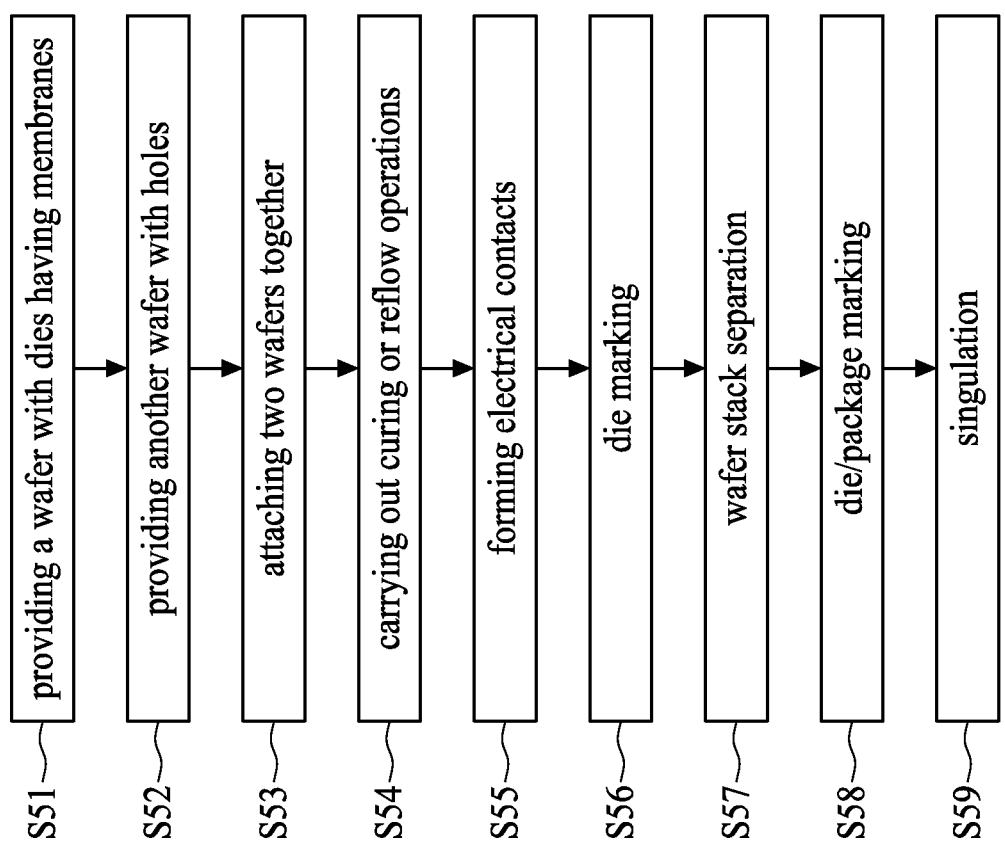
FIG. 5 illustrates a flow chart of a method for manufacturing an electrical device in accordance with some embodiments of the present disclosure.

FIG. 5 illustrates a flow chart of a method for manufacturing an electrical device in accordance with some embodiments of the present disclosure. FIG. 6A, FIG. 6B, FIG. 6C and FIG. 6D illustrate a method for manufacturing the electrical device as shown in the operations of the flow chart of FIG. 5 (or a portion of the operations in the flow chart of FIG. 5) in accordance with some embodiments of the present disclosure. In some embodiments, the method in FIG. 5, FIG. 6A, FIG. 6B, FIG. 6C and FIG. 6D can be used to manufacture the electrical device 2, 3 or 4 in FIG. 2, FIG. 3 or FIG. 4.

Figure 6D:
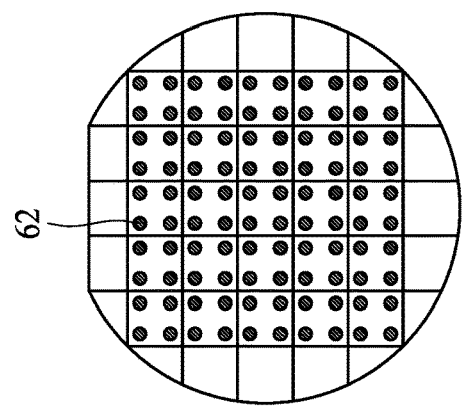
FIG. 6A, FIG. 6B, FIG. 6C and FIG. 6D illustrate a method for manufacturing an electrical device in accordance with some embodiments of the present disclosure.
Figure 6C:
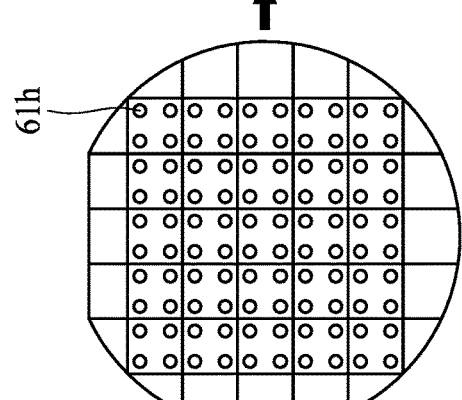
Figure 6B:
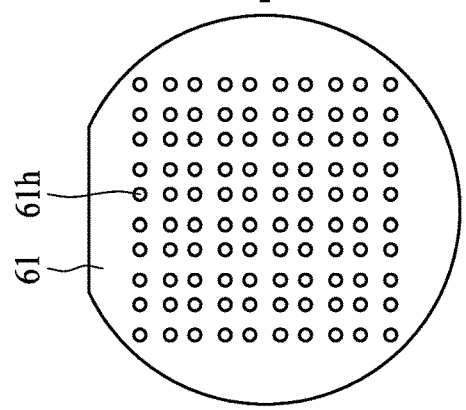
Figure 6A:
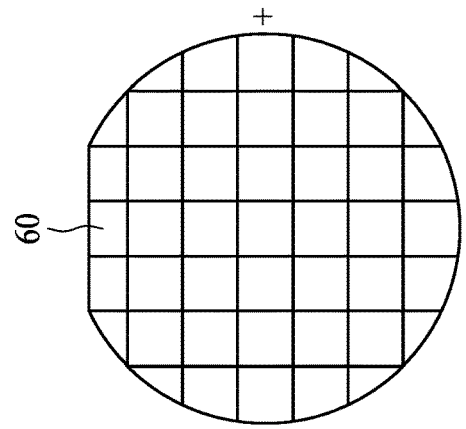

Referring to operation S51, a wafer 60 as shown in FIG. 6A is provided. In some embodiments, the wafer 60 may be a Si wafer or a SiC wafer. The wafer 60 may include a plurality of electronic components (or dies) including the electronic component 20 in FIG. 2, FIG. 3 or FIG. 4. For example, each electronic component of the wafer 60 may include a cavity to accommodate a membrane, which allows the membrane resonating within the cavity. For example, the wafer 60 may include a plurality of conductive pads (or die pads) and metal rings surrounding cavities of the wafer 60. In some embodiments, the metal rings are formed of low melting point metal or eutectic metal.

Referring to operation S52, a wafer 61 as shown in FIG. 6B is provided. In some embodiments, the wafer 61 may be a Si wafer or a glass wafer. As shown in FIG. 6B, the wafer 61 may include a plurality of holes 61h.

Referring to operation S53, the wafer 60 is attached to the wafer 61 by, for example, an adhesive layer (e.g., covalent bonding, metallic bonding (e.g., AuSn) glue or tape, not shown in the drawing) as shown in FIG. 6C. In some embodiments, the holes 61h of the wafer 61 expose die pads of the wafer 61. In some embodiments, the wafer 60 is aligned with the wafer 61 to bring the metal to eutectic temperature to create hermetic seal around the cavities of the wafer 60.

In other embodiments, the wafer 61 with a polymer adhesive coating is provided to be adhered to the wafer 60. The holes 61h of the wafer 61 can be created after the wafer 60 and the wafer 61 are laminated but would be created to selectively expose conductive pads on the wafer 60.

Referring to operation S54, a curing or reflow process may be carried out. In some embodiments, the operation S54 can be omitted depending on different design specifications.

Referring to operation S55, electrical contacts 62 (e.g., solder balls) are formed within the holes 61h of the wafer 61 to form a structure as shown in FIG. 6D. For example, the electrical contacts 62 can be formed by wafer-level ball drop, screen printing, plating or any other suitable processes.

Referring to operation S56, die marking can be formed on a backside of the wafer 60. In some embodiments, the operation S54 can be omitted depending on different design specifications. Referring to operation S57, wafer stack separation is performed by using, for example, mechanical sawing or laser sawing. Referring to operation S58, die/pack marking is carried out. In some embodiments, the operation S54 can be omitted depending on different design specifications. Referring to operation S59, a singulation is carried out to separate the wafer into individual dies/packages.

Compared to operations for forming the electrical devices 1A and 1B, the operations as illustrated in FIG. 5, FIG. 6A, FIG. 6B, FIG. 6C and FIG. 6D at least include the following advantages: protecting the sensor area (e.g., a space where the membrane 21 in FIG. 2, 3 or 4 is located) from the contamination (e.g., flux, water wash, etc.) during the process for forming the electrical contacts (e.g., ball attach process), allowing a fixed location for ball drop (controls the location of the solder ball) and performing lamination process in a vacuum to create a hermetic space for the sensor area. Furthermore, if the hermetic space is not required, holes can be created for the wafer 61 to allow air venting (e.g., releasing gas) during the reflow operation.

Figure 7:
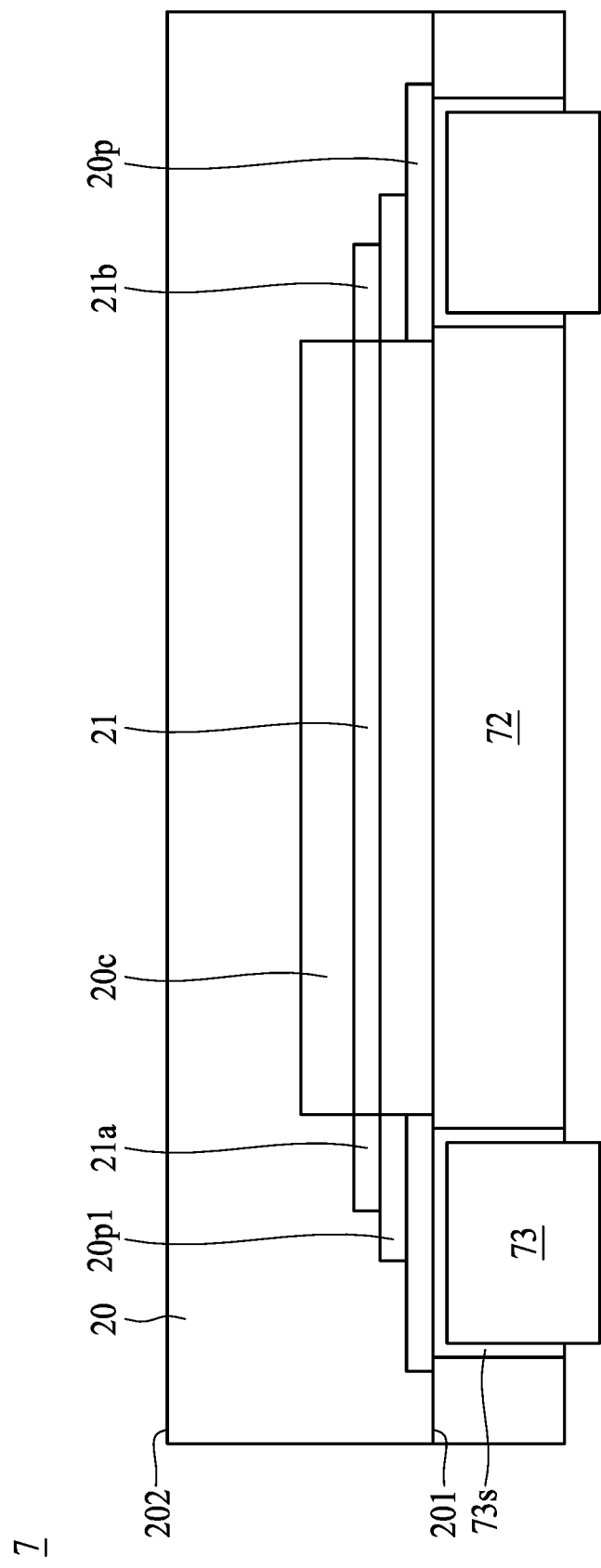
FIG. 7 illustrates a cross-sectional view of an electrical device in accordance with some embodiments of the present disclosure.

FIG. 7 illustrates a cross-sectional view of an electrical device 7 in accordance with some embodiments of the present disclosure. The electrical device 7 in FIG. 7 is similar to the electrical device 3 in FIG. 3, and the differences therebetween are described below.

In some embodiments, the electrical device 7 includes a cover 72 disposed on the surface 201 of the electronic component 20. The cover 72 is formed of or includes a photoresist, such as a photo-imageable photoresist. The cover 72 includes one or more openings filled with a seed layer 73s and a conductive pillar 73. The seed layer 73s is disposed on a sidewall of the cavity defined by the cover 72 and on the conductive pad 20p. The conductive pillar 73 is disposed within the cavity defined by the cover 72 and on the seed layer 73s. In some embodiments, the seed layer 73s includes titanium (Ti) and/or copper (Cu). In some embodiments, the conductive pillar 73 may include Cu, gold (Au), silver (Ag) or its alloy. In some embodiments, a barrier layer and a solder layer may be disposed on a surface of the conductive pillar 73 facing away from the electronic component 20.

Compared with the use of glass or silicon cover, using the photoresist as the cover 72 may have a better alignment and a less thickness. In addition, compared with a solder ball, the conductive pillar 73 can be connected to the cover 72 and the conductive pad 20p more tightly, which can avoid the ball drop issue.

FIG. 8A, FIG. 8B, FIG. 8C, FIG. 8D and FIG. 8E illustrate a method for manufacturing an electrical device in accordance with some embodiments of the present disclosure. In some embodiments, the method illustrated in FIG. 8A, FIG. 8B, FIG. 8C, FIG. 8D and FIG. 8E can be used to manufacture the electrical device as shown in FIG. 7.

Figure 8A:
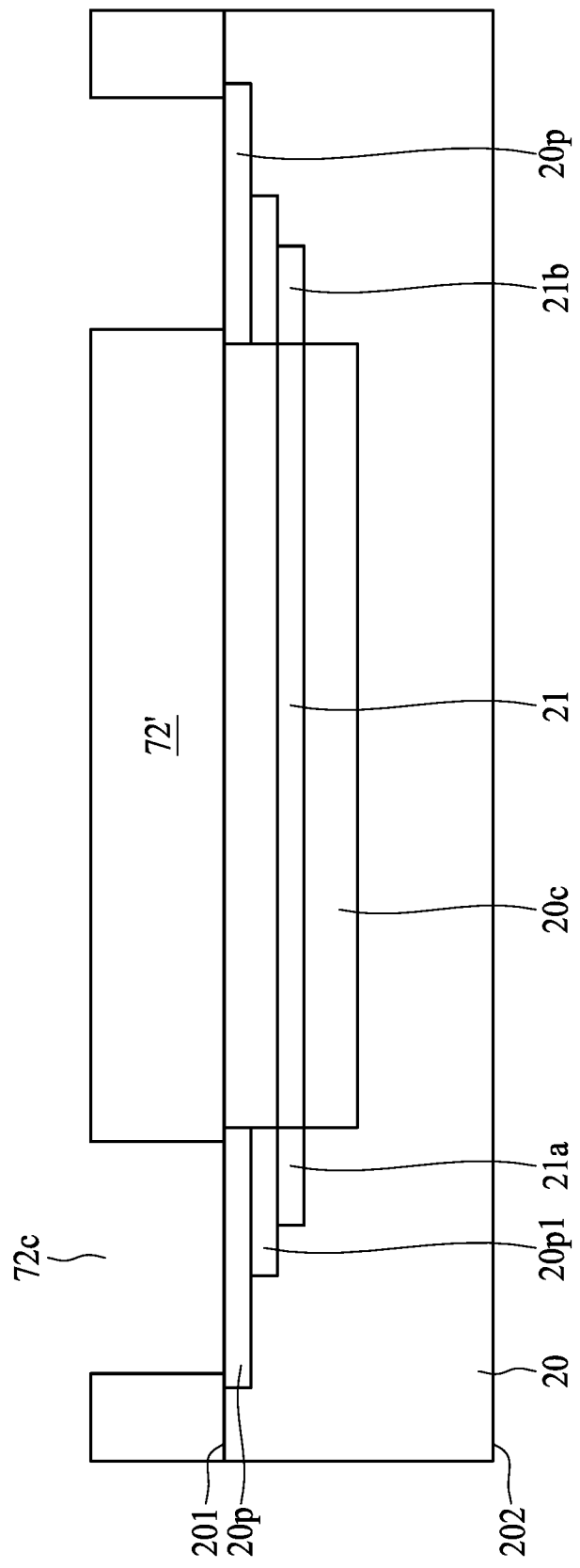
FIG. 8A, FIG. 8B, FIG. 8C, FIG. 8D and FIG. 8E illustrate a method for manufacturing an electrical device in accordance with some embodiments of the present disclosure.

Referring to FIG. 8A, an electronic component 20 as shown in FIG. 7 or a wafer including the electronic component 20 as shown in FIG. 7 is provided. A photoresist 72' is disposed on the surface 201 (e.g., active surface) of the electronic component 20. The photoresist 72' may include one or more openings or cavities 72c to expose the conductive pad 20p on the surface 201 of the electronic component 20.

Figure 8B:
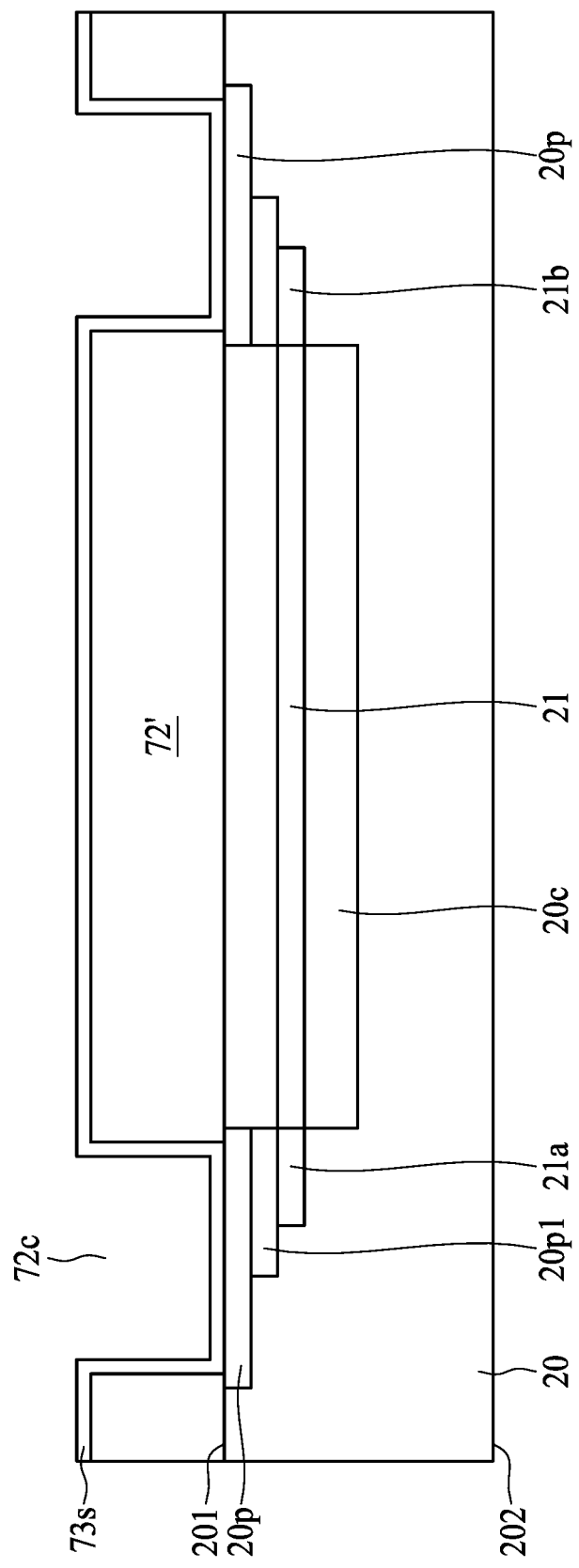

Referring to FIG. 8B, a seed layer 73s is formed on a surface of the photoresist 72' facing away from the electronic component 20, a sidewall of the cavity 72c and the conductive pad 20p exposed from the photoresist 72'. In some embodiments, the seed layer 73s may be formed by sputtering or other suitable processes.

Figure 8C:
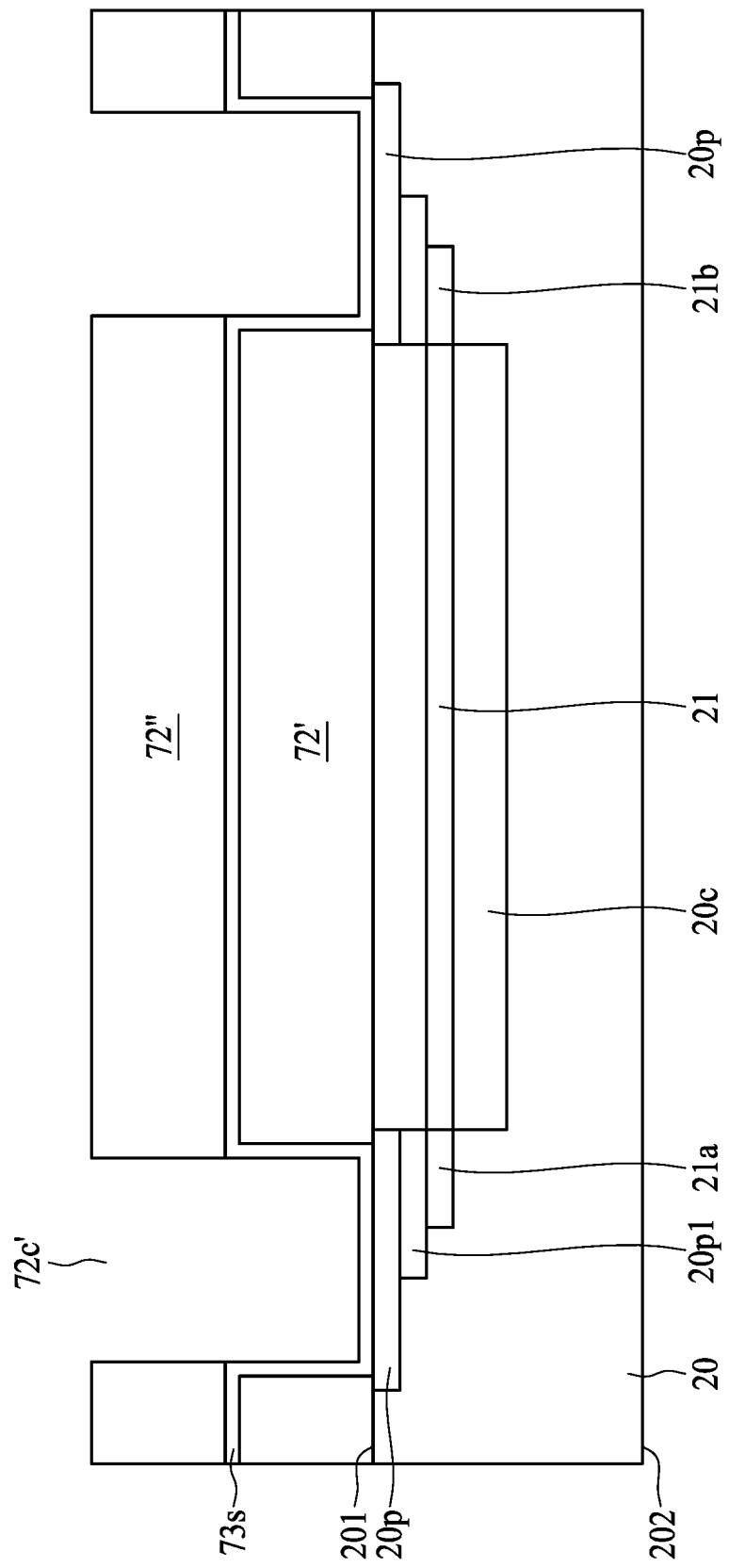

Referring to FIG. 8C, a photoresist 72" is disposed on the photoresist 72'. In some embodiments, the photoresist 72" and the photoresist 72' may include the same or different materials depending on different design specifications. The photoresist 72″ may include one or more openings or cavities 72c′ corresponding to the cavities 72c defined by the photoresist 72′. For example, the cavities 72c′ expose the cavities 72c and a portion of the seed layer 73s exposed from the cavities 72c. In some embodiments, a width of the cavities 72c′ is substantially the same as the cavities 72c.

Figure 8D:
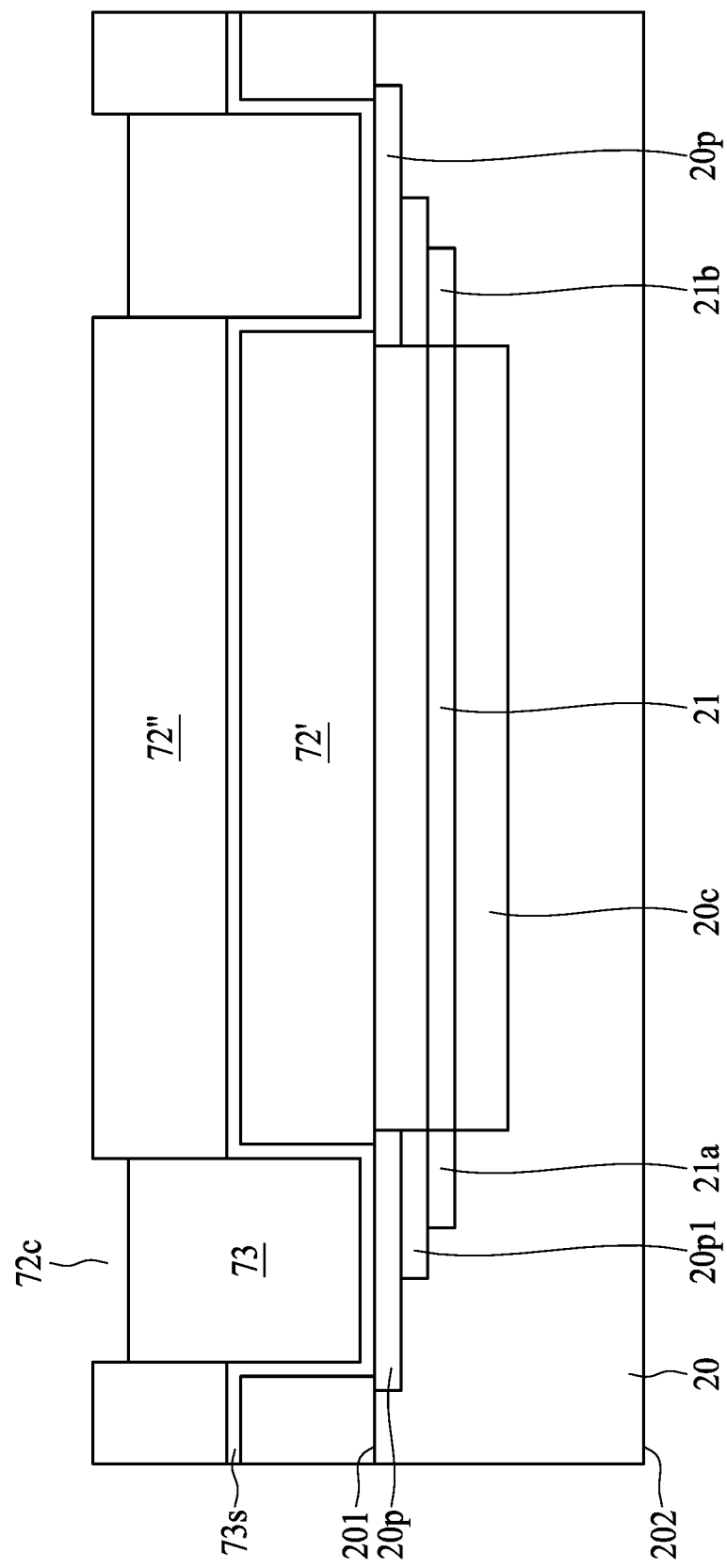

Referring to FIG. 8D, a conductive pillar 73 is formed within the cavities 72c and 72c′ and on the seed layer 73s. In some embodiments, the conductive pillar 73 may be formed by, for example, plating or any other suitable processes. In some embodiments, a barrier layer and/or a solder layer may be formed on the conductive pillar 73.

Figure 8E:
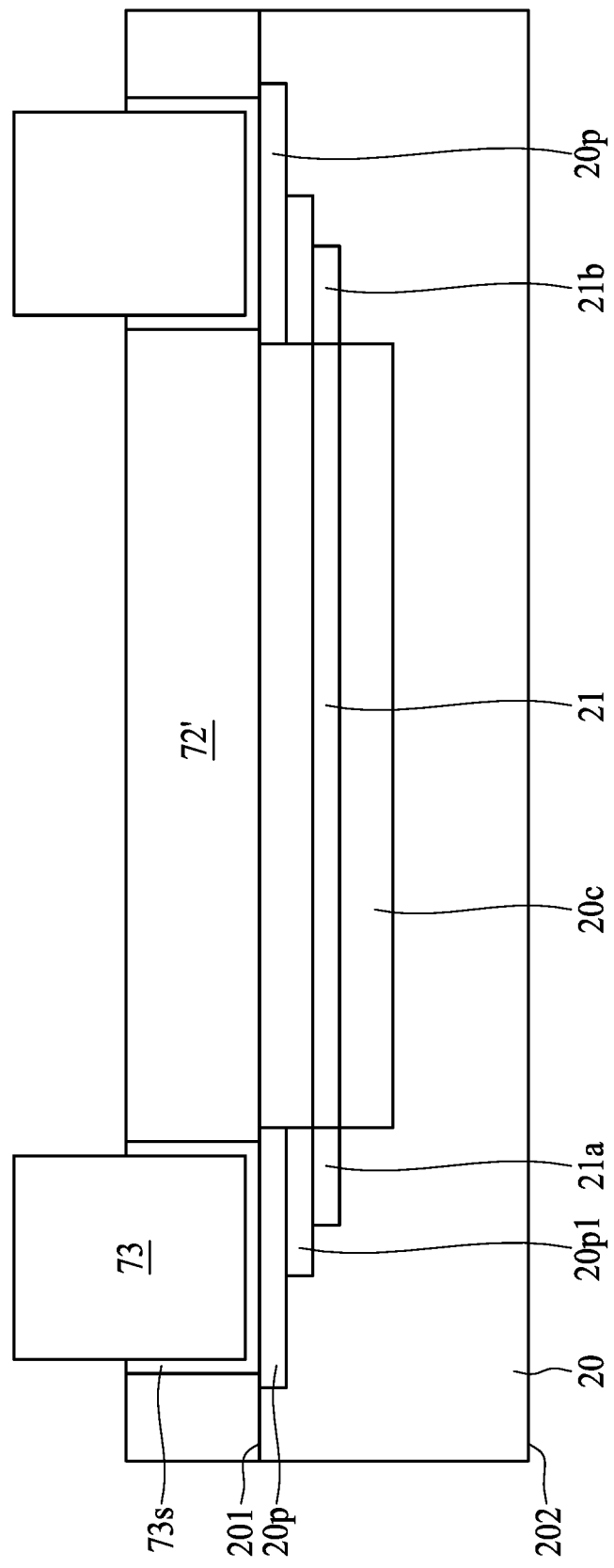

Referring to FIG. 8E, the photoresist 72″ is removed. A portion of the seed layer 73 is then removed to from the electrical device 7 as shown in FIG. 7. In some embodiments, the seed layer 73 may be removed by, for example, etching or any other suitable processes. In some embodiments, if the barrier layer and the solder layer are formed on the conductive pillar 73 during the operation illustrated in FIG. 8D, a reflow operation may be carried out after the removal of the seed layer 73 to increase the planarity of the solder layer.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package, comprising:
   an electrical element having a first surface and a second surface opposite to the first surface;
   a cover disposed adjacent to the first surface of the electrical element, the cover having a plurality of openings penetrating the cover; and
   a plurality of electrical contacts electrically connected to the electrical element through the openings,
   wherein the electrical element further comprises at least one cavity defined between the first surface and the second surface of the electrical element and a membrane located in the cavity of the electrical element, and
   wherein the membrane is electrically connected to the electrical element.

2. The semiconductor package of claim 1, wherein the electronic element is free from a through via structure.

3. The semiconductor package of claim 1, wherein the cavity is sealed by the electrical element and the cover.

4. The semiconductor package of claim 1, wherein a distance between any two of the openings is greater than a dimension of the least one cavity within the electrical element.

5. The semiconductor package of claim 1, wherein the membrane further comprising:
   a movable portion physically isolated from the electrical element; and two electrodes electrically connected to conductive pads of the electrical element.

6. The semiconductor package of claim 5, wherein the openings expose the conductive pads.

7. The semiconductor package of claim 5, wherein the electrical contacts are in contact with the conductive pads.

8. The semiconductor package of claim 5, further comprising a connection structure disposed between each of the electrodes and the corresponding conductive pad.

9. The semiconductor package of claim 5, further comprising a seed layer disposed between a sidewall of the openings and the electrical contacts and between the conductive pads and the electrical contacts.

10. The semiconductor package of claim 1, further comprising a fence structure extending in a direction substantially perpendicular to the membrane, and the fence structure covers a portion of the membrane.

11. The semiconductor package of claim 10, wherein the fence structure defines a plurality of openings and another portion of the membrane is exposed from the openings.

12. A semiconductor package, comprising:
an electrical element comprising a first surface and a second surface opposite to the first surface; and
a cover disposed adjacent to the first surface of the electrical element and configured to protect the electrical element, the cover having a plurality of openings for electrical connections between the electrical element and outside,
wherein the electrical element further comprises at least one cavity defined between the first surface and the second surface of the electrical element and a membrane located in the cavity of the electrical element, and
wherein the membrane is electrically connected to the electrical element.

13. The semiconductor package of claim 12, wherein a distance between any two of the openings is greater than a dimension of the least one cavity within the electrical element.

14. The semiconductor package of claim 12, wherein the membrane further comprising:
a movable portion physically isolated from the electrical element; and
two electrodes electrically connected to conductive pads of the electrical element.

15. The semiconductor package of claim 14, wherein the openings expose the conductive pads.

16. The semiconductor package of claim 14, further comprising a plurality of electrical contacts electrically connected to the electrical element through the openings.

17. The semiconductor package of claim 16, wherein the electrical contacts are in contact with the conductive pads.

18. The semiconductor package of claim 14, further comprising a connection structure disposed between each of the electrodes and the corresponding conductive pad.

* * * * *